United States Patent

Mogul et al.

[11] Patent Number: 6,091,114
[45] Date of Patent: Jul. 18, 2000

[54] METHOD AND APPARATUS FOR PROTECTING GATE OXIDE FROM PROCESS-INDUCED CHARGING EFFECTS

[75] Inventors: Homi C. Mogul, Dallas; Joe W. McPherson, Plano; Bob Strong, Sachse; Anand Seshadri, Plano, all of Tex.

[73] Assignee: Texas Instruments Incorporated, Dallas, Tex.

[21] Appl. No.: 09/052,258

[22] Filed: Mar. 31, 1998

Related U.S. Application Data

[60] Provisional application No. 60/042,553, Apr. 3, 1997.

[51] Int. Cl.$^7$ .............................. H01L 23/62; H02H 9/04
[52] U.S. Cl. .......................... 257/360; 257/409; 257/491; 361/56
[58] Field of Search ...................................... 257/360, 311, 257/355, 356, 491, 289, 393, 409; 361/56, 58

[56] References Cited

U.S. PATENT DOCUMENTS

| | | | |
|---|---|---|---|
| 4,924,339 | 5/1990 | Atsumi et al. | 257/360 |
| 5,760,445 | 6/1998 | Diaz | 257/356 |
| 5,793,069 | 8/1998 | Schuelein et al. | 257/360 |

*Primary Examiner*—Donald L. Monin, Jr.
*Attorney, Agent, or Firm*—Wade James Brady, III; Richard L. Donaldson

[57] ABSTRACT

A semiconductor device includes a first transistor (52) and gated diode (50) formed at a face of a semiconductor layer (56). The first transistor (52) includes a source region (60a), a drain region (60b), a gate oxide layer (62), and a conductive gate (64). The gated diode (54) includes a first moat region (66a), a second moat region (66b), a gate oxide layer (68), and a conductive gate (70). A first conductor (77) connects the conductive gate (70) of the gated diode (54) to the semiconductor layer (56) and a second conductor (76) connects the moat regions (66a, 66b) of the gated diode (54) to the conductive gate (64) of the first transistor (52). Gated diode (54) has a reduced breakdown voltage relative to the gate oxide layer (62) of first transistor (52) and thus establishes a leakage path to semiconductor layer (56) to direct leakage current to semiconductor layer (56), thereby inhibiting charge from accumulating on the gate oxide layer (62) of first transistor (52).

10 Claims, 2 Drawing Sheets

METHOD AND APPARATUS FOR PROTECTING GATE OXIDE FROM PROCESS-INDUCED CHARGING EFFECTS

This application claims priority under 35 USC §119(e)(1) of provisional application Ser. No. 60/042,553 filed Apr. 3, 1997.

FIELD OF THE INVENTION

This invention relates to semiconductor processing technology, and more particularly to the protection of components of semiconductor devices from process-induced charging effects.

BACKGROUND OF THE INVENTION

The antenna effect is the name given to the phenomena of induced voltages that can collect on partially processed leads. The effect is partially prevalent during plasma processing e.g., etching, deposition and ashing and ion implantation, and can lead to damage to thin gate oxide regions of the device under construction.

Process-induced charging and ensuing gate oxide damage constitutes a significant yield and reliability detriment for submicron CMOS technology. Problems occur at many stages of processing, but are aggravated by long lead lengths at poly lead definition following polysilicon deposition. As devices are further scaled to reduced geometries, the gate oxide becomes progressively thinner and hence more susceptible to damage, even at reduced voltages. The etch step is particularly problematic for metal, especially during lead separation and differentiation, and for plasma enhanced interlevel dielectric depositions.

Charge accumulation on partially processed leads, and the resultant voltage increase, can cause voltage overstress and result in charge trapping in gate oxides and gate oxide breakdown. Previously, simple n+/p or p+/n junction diodes were used to protect oxides from the antenna effect during VLSI processing. As gate oxides have become thinner in reduced geometry devices, such as 0.5 micron and further reduced geometry devices, gate oxide damage tends to occur prior to protective junction diode breakdown. As a consequence, use of the diode for protection from the antenna effect discussed above becomes ineffective as the gate oxide thickness is scaled below thicknesses of about 100 Å (Angstroms), which have breakdown voltages on the order of about 16 volts or less. Accordingly, it would be desirable to provide an alternative type of protective device that is operable to protect gate oxides having thicknesses below about 100 Å, as can be expected to be required in future generation ULSI (i.e., less than 100 Å gate oxide thickness) and further reduced geometry devices.

FIG. 1 depicts a portion 10 of a conventional semiconductor device which gives rise to the charge induced antenna effect. It is to be appreciated that the illustrated device can be constructed in accordance with a variety of known processing techniques, the specific manner of processing not being relevant to the following discussion. The semiconductor portion 10 includes a substrate 12 that is typically formed from a semiconductive material such as silicon which is doped with a p-type impurity. The semiconductor substrate 12 can also be formed from a variety of other semiconductive materials, such as GaAs and HgCdTe, for which the principles of the present invention that are set forth below are likewise applicable. In the illustrated structure, a VLSI device under construction is designated generally by reference character 16, and the associated protective component is designated generally by reference character 20. The protective component that is presently utilized in the art is typically an $n^+/p$ or a $p^+/n$ junction diode.

The device portion 10 includes field oxide regions 24a–24c, which can be developed in the substrate 12 in a conventional manner, such as by thermal growth, to a thickness of about 400–1,000 nm. Interposed between the field oxide regions 24a and 24b is a gate oxide region 26 that is typically thermally grown to a thickness of about 4–20 nm. A layer of polysilicon 28 is patterned and applied in an appropriate manner over the gate oxide 26 and doped with an appropriate impurity, such as phosphorus, to render the polysilicon 28 layer conductive. Dielectric film 30 is applied over the polysilicon and underlying field oxide regions 24 and is patterned and etched to create a channel 22 such as a via or contact opening that extends from an upper surface of the dielectric 30 to an upper surface of the polysilicon 28 and a channel 33 that extends from an upper surface of the dielectric 30 to moat region 36. The vias 22 and 33 can be filled with an appropriate metal conductor 34, such as an alloy of aluminum or copper, to establish electrical contact between non-adjacent levels of the device 10.

The illustrated junction diode 20 includes moat region 36 which is typically doped with an $n^+$ impurity to produce an $n^+/p$ junction diode. The junction diode 20 is electrically connected to the device gate oxide 26 by metal lead line 34, thereby permitting the junction diode to preferentially leak electric current from the gate oxide region 26 and thereby protect the gate oxide 26 from currents that may pass through the device. Such a protection scheme is suitable for device geometries in excess of about $0.8\mu$ (microns). However, for reduced geometries, particularly device geometries below about $0.8\mu$ (microns), for which the corresponding gate oxide layers are of reduced thickness and therefore more susceptible to charge-induced leakage currents, such protection schemes have not proven satisfactory to adequately protect the structural integrity of the gate oxide.

BRIEF DESCRIPTION OF THE DRAWINGS

Embodiments of the relevant prior art and of the invention have been selected for purposes of illustration and description, and are depicted with reference to the accompanying drawings, in which.

DETAILED DESCRIPTION OF THE PREFERRED EMBODIMENTS

Figure 1:
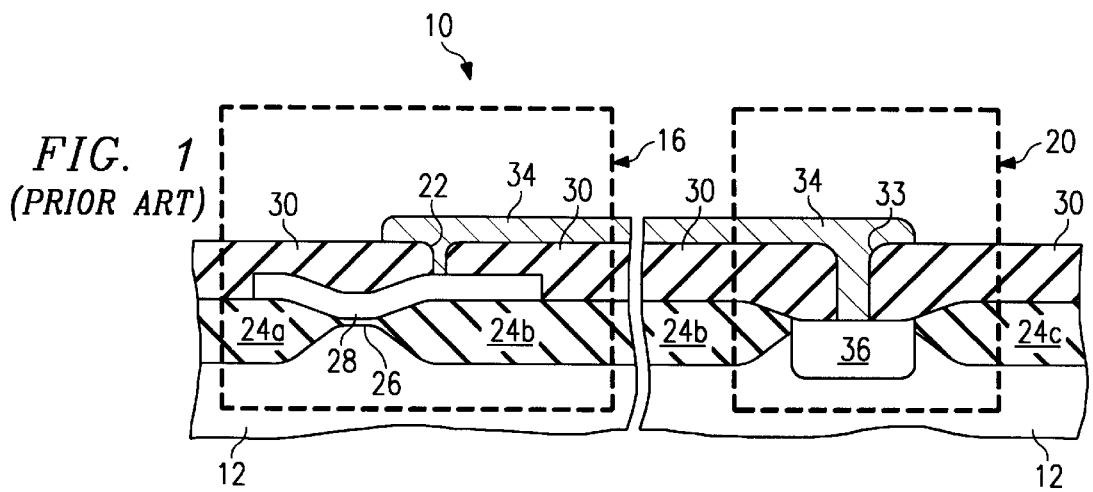
FIG. 1 is a schematic of a prior art structure.

It is to be understood and appreciated that the process steps and structures described below do not form a complete process flow for the manufacture of integrated circuits. The present invention can be practiced in conjunction with various integrated circuit fabrication techniques that are used in the art, and only so much of the commonly practiced process steps are included herein as are necessary to provide an understanding of the present invention. The drawing figures that are included with this specification and which represent cross-sections of portions of an intergrated circuit during fabrication are not drawn to scale, but instead are drawn so as to illustate the relevant features of the invention.

As the semiconductor industry shifts toward further reduced geometry devices such as those geometries smaller than 0.8 μm (e.g., 0.5 μm, 0.35 μm, 0.25 μm, 0.18 μm etc.) and further reduced geometries, thinner gate oxides will be required. As gate oxide thickness diminishes, the associated gate oxide breakdown voltage correspondingly diminishes, as indicated in the following chart:

| Gate Oxide Thickness (Å) | Breakdown Voltage (v) |
| --- | --- |
| 200 | 24 |
| 150 | 18 |
| 130 | 16 |
| 90 | 11 |
| 60 | 7 |
| 35 | 4 |

For device geometries requiring gate oxide thicknesses of about 100 Å (Angstroms) or less, the corresponding breakdown voltage is at a level that is at, or even below, the breakdown voltage for the associated protective junction diode. As a result, the diode protection becomes ineffective as the gate oxide thickness diminishes below thicknesses of about 100 Å (Angstroms), resulting in undue exposure of gate oxide structural integrity to destructive leakage currents.

As will be described in greater detail below, the present invention relates to the provision of a gated diode in place of a conventional junction diode for protecting the gate oxide from destructive leakage currents. Because the gated diode of the present invention exhibits a reduced breakdown voltage relative to the gate oxide with which it is connected, the gated diode establishes a leakage path to the substrate that preferentially directs leakage currents to the substrate, thereby inhibiting charge from accumulating on the associated gate oxide. Preferably, the gated diode is implemented with an NMOSFET whose drain and source are connected to the antenna node, with the gate being grounded (i.e., tied to the substrate).

Figure 2:
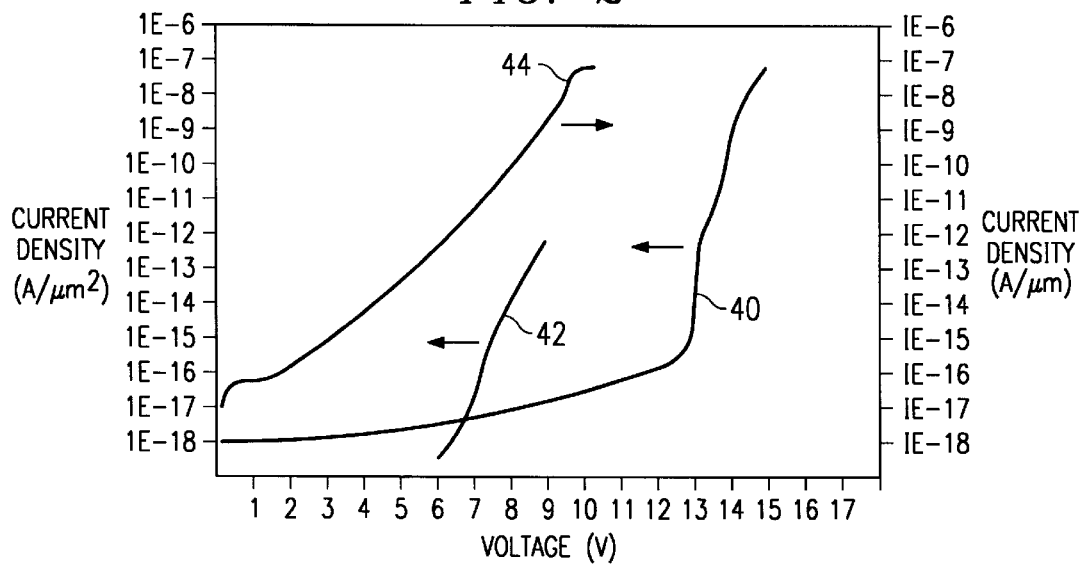
FIG. 2 is a graph relating voltage and current density for various structures.

With reference to FIG. 2, there is depicted the respective current density and voltage characteristics of a conventional p+/n junction diode 40, n-well MOS capacitor 42, and p+/n gated diode 44 in accordance with the teachings of the present invention. The illustrated diode characteristics are obtained in a reverse bias mode, whereas the current and voltage characteristics of the capacitor are acquired in an accumulation mode. The illustrated graphs for the junction diode 40 and gate oxide capacitor 42 are plotted in units of amps/μm² along the left ordinate of the graph, whereas the gated diode 44 of the present invention is plotted in units of amps/μm along the right ordinate. Arrows associated with each graph direct the reader to the appropriate reference axis. These respective graphs illustrate the following characteristics of the represented semiconductor components:

1. The junction diode 40 affords minimal protection up to about 12–13 volts, as the graph slope is negligible;
2. The breakdown voltage of the junction diode 40 (which is about 13 volts) is far greater than that for the gate oxide (~6 volts) and, as such, for voltages in excess of about 6 volts, the traditional junction diode 40 will provide ineffective protection; and
3. Perimeter leakage current (amps/μm) for the gated diode 44 is much greater than the area leakage (amps/μm²) of the gate oxide 42 and, as such, will offer protection to the gate oxide, particularly at levels below about 6 volts. Similar results are obtainable with n+/p gated diode structures.

For a conventional NMOS or PMOS device, such as that depicted in FIG. 1, the gate oxide 26 and field oxide 24 can be regarded as capacitor $C_{g\text{-}ox}$ and $C_{f\text{-}ox}$, respectively, that are connected in parallel. As such, the effective antenna capacitance for the structure can be written as:

$$C_{antenna} = C_{gox} + C_{fox}$$

Since, for any capacitor C, $$C = \frac{\varepsilon A}{t},$$

where

A=oxide surface area;
ε=dielectric permittivity of the material; and
t=oxide thickness, then $$C_{antenna} = \frac{\varepsilon A_{gox}}{t_{gox}} + \frac{\varepsilon A_{fox}}{t_{fox}}$$

$$C_{antenna} = \varepsilon \left[ \frac{A_{gox}}{t_{gox}} + \frac{A_{fox}}{t_{fox}} \right]$$

$$C_{antenna} = \varepsilon \frac{A_{gox}}{t_{gox}} \left[ \frac{A_{fox}}{t_{fox}} * \frac{t_{gox}}{A_{gox}} + 1 \right]$$

$$C_{antenna} = C_{gox} \left[ \frac{A_{fox}}{A_{gox}} * \frac{t_{gox}}{t_{fox}} + 1 \right]$$

An antenna ratio can be defined as follows:

$$\text{Antenna Ratio} = \frac{A_{fox}}{A_{gox}}$$

From this antenna ratio, the antenna capacitance can be defined as:

$$C_{antenna} = C_{gox} \left[ (\text{Antenna Ratio}) * \frac{t_{gox}}{t_{fox}} + 1 \right] \quad (1)$$

For a charge, Q, that is collected between the plates of the capacitor during the course of substrate processing, $$Q = C_{antenna} * V$$

where V is applied voltage. Accordingly, $$\frac{dQ}{dt} = C_{antenna} * \frac{dV}{dt}$$

For a constant current flow through the device, $$\frac{dQ}{dt} = C_{antenna} * V$$

As such, $$Io \cong C_{antenna} * \frac{\Delta V}{\Delta t}$$

Substituting for $C_{antenna}$ from Equation (1) yields $$I_o = C_{gox}\left[\text{Antenna Ratio} * \left(\frac{A_{gox}}{A_{fox}}\right) + 1\right] * \frac{\Delta V}{\Delta t} \quad (2)$$

When a gated diode is introduced into the circuit as a protection device, the circuit can be represented by a parallel array of a gated diode and the foregoing antenna capacitor $C_{antenna}$. As such, the voltage drop across each component is the same, and the total circuit current $I_o$ can be represented by:

$$I_o = I_{gated\ diode} + I_{gate\ oxide}$$

The gated diode can be characterized by the following values:

$$J_l = \text{Current}/\mu m$$

$$L = \text{Gate Edge Perimeter}(\mu m)$$

thus giving rise to the following relationship:

$$I_{gated\ diode} = J_l * L$$

Correspondingly, the gate oxide can be characterized by the following values:

$$J_a = \text{current}/\mu m^2$$

$$A_{gox} = \text{Area of gate oxide } \mu m^2$$

giving rise to the following relationship:

$$I_{gox} = J_a * A_{gox}$$

Substituting the foregoing relationship yields the following:

$$I_o = (J_l * L) + (J_a * A_{gox}) \quad (3)$$

Utilizing Equations (2) and (3) to solve for L, the perimeter of the gated diode that is required for protection against charging is given by:

$$L = \frac{C_{gox}\left[\text{Antenna Ratio} * \left(\frac{t_{gox}}{t_{fox}}\right) + 1\right] * \frac{(\Delta V)_{max}}{\Delta t} - (J_a * A_{gox})}{J_l} \quad (4)$$

where $(\Delta V)_{max}$ = maximum permissible voltage rise $\Delta t$ = time during which wafer is exposed to charging $J_a$ = area current density for gate oxide at $(\Delta V)_{max}$ $J_l$ = perimeter current density for gated diode at $(\Delta V)_{max}$ $t_{gox}$ = thickness of gate oxide $t_{fox}$ = thickness of field oxide $A_{gox}$ = area of gate oxide $A_{fox}$ = area of field oxide In view of the foregoing relationships, a gated diode can be constructed to protect an associated device from undesired charge induced antenna effects incident to charging for a prescribed period of time. Configurations of such gated diodes are provided below. With reference to FIGS. 3–6, there are illustrated various structures and charge states for the gated diode protection schemes of the present invention in connection with PMOS structures (FIGS. 3 & 4) and NMOS structures (FIGS. 5 & 6), respectively, depicted at relevant stages of construction. Suitable MOS devices with which the teachings of the present invention can be used include, by way of non-limiting example, digital signal processors, microprocessors, memories.

Figure 3:
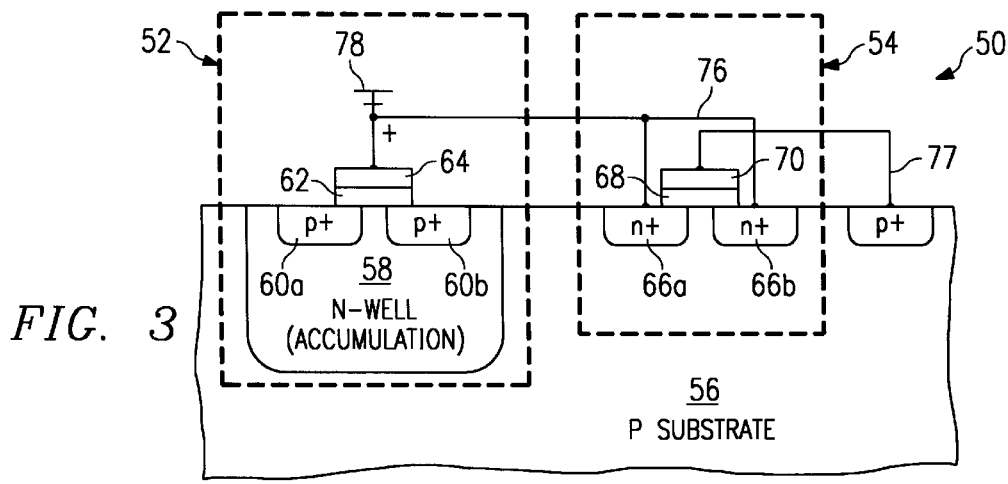
FIGS. 3–6 are schematic illustrations of gate oxide protection schemes in accordance with the present invention.

Referring particularly to FIG. 3, a PMOS structure 50 is depicted that includes a device under construction, defined generally by reference character 52, and a gated diode protection circuit, designated generally by reference character 54, both of which are constructed in a p-substrate 56 that is formed from a suitable semiconductor material, such as silicon. The semiconductor substrate 56 can also be formed from a variety of other semiconductive materials, such as GaAs and HgCdTe, for which the principles of the present invention that are set forth below are likewise applicable. The device under construction includes an n-well 58 that extends into the substrate 56. Source 60a and drain 60b regions that are each doped p⁺ extend into the n-well 58. A thin gate oxide film 62, typically having a thickness of 90 Å, overlies and connects the source 60a, drain 60b and n-well 58 and supports overlying polygate 64. It is this gate oxide film 62 that is subject to the process-induced charging or "antenna effect" problems and structural degradation discussed previously.

The preferred embodiment of the gate oxide protection circuit 54 of the present invention is an n⁺/p gated diode, as is illustrated in FIG. 3, as the n⁺/p gated diode is capable of protecting both NMOS and PMOS devices. The n⁺/p gated diode 54 includes laterally spaced n⁺ moat regions 66a and 66b, respectively, over which is developed a gate oxide layer 68 and an overlying polygate 70. The moat regions 66a and 66b are electrically connected to one another, as indicated by metal lead line 76, whereas the gate oxide 68 is tied to the substrate 56 by metal lead line 77. Lead line 76 is also connected to an antenna 78, which may be a long line of metal or polysilicon, for example. Lead line 76 is also connected to the device gate 64, thereby coupling the gated diode 54 to the device 52 and providing a conductive path for leakage current away from the gate oxide 62. It is to be appreciated that certain steps, such as development of the gate oxide regions 62 and 68 and application of polygate films 64 and 70, can be applied during concurrent process steps to enhance manufacturing efficiency. Moreover, while the protection circuit 54 can alternatively be configured as a p⁺/n gated diode, such is less desirable, as the n-well would tend to "float" during processing, thereby compromising its ability to protect the gate oxide of an associated device. Accordingly, for manufacturing simplicity, construction of the more universally-applicable n⁺/p gated diode is preferred. In instances where a positive charge is applied to the polygate 64, as is shown in FIG. 3, and the PMOS transistor attains a prescribed maximum voltage change (increase) $\Delta V_{max}$, then the n-well 58 is in accumulation. In this instance, the illustrated n⁺/p gated diode 54 will be in reverse bias and current ($J_l$) through the gated diode 54 will be related to current ($J_a$) through the gate oxide 62, such that $J_l > J_a$, thereby affording protection to the gate oxide 62 through the shunting or leakage of current through the gated diode 54 to the substrate.

Figure 4:
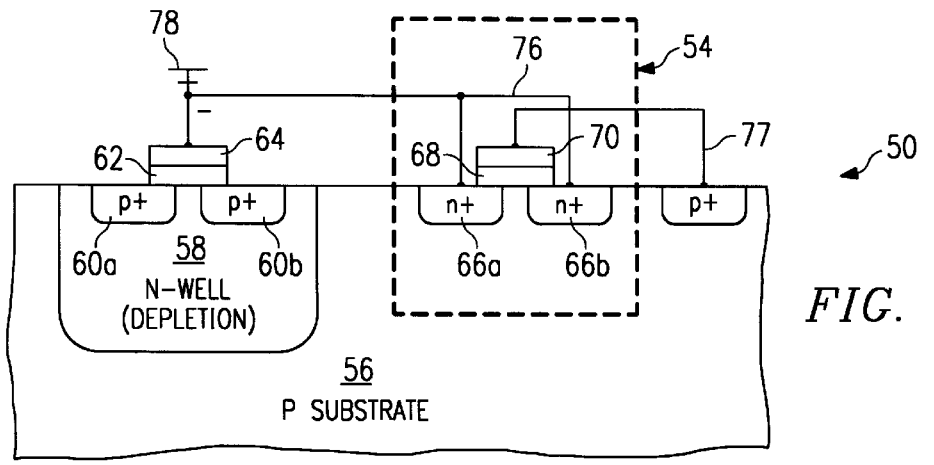

In instances where a negative charge is applied to the polygate 64, as illustrated in FIG. 4, the n⁺/p gated diode will be in forward bias and therefore afford continuous protection to the gate oxide 62 since the leakage current of the forward biased gated diode will always be greater than that of the gate oxide.

Figure 5:
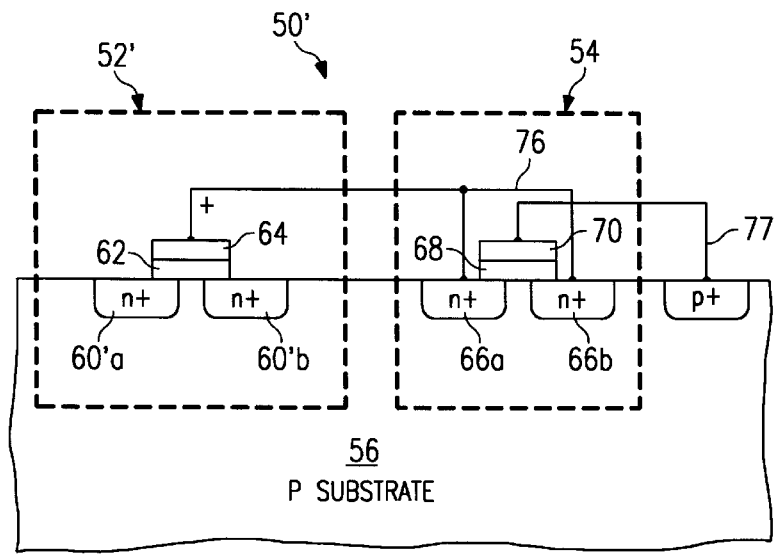
Figure 6:
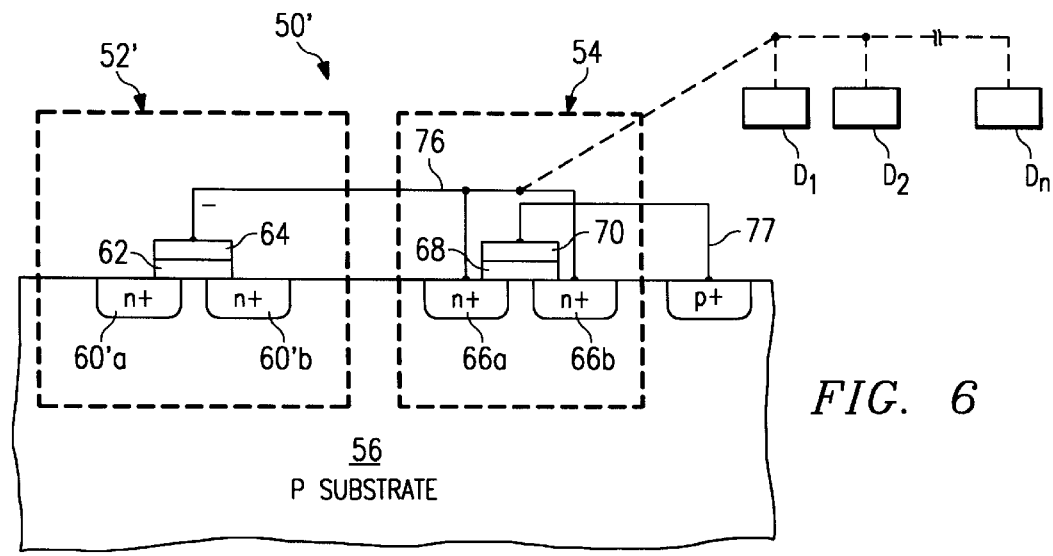

FIGS. 5 and 6 depict an NMOS structure 50' with which the teaching of the present invention are likewise applicable. In this illustrated embodiment, the protective circuit 54 is associated with an NMOS device under construction, designated generally by 52'. In contrast to the p+ source and drain regions 60a and 60b, respectively, of the PMOS structure 50 described above with reference to FIGS. 3 and 4, the device 52' under construction includes n⁺ source and drain regions 60'a and 60'b, respectively, that have been developed by conventional processing practices in substrate 56. Other aspects of the PMOS device 50, with the exception of n-well 58, carry over to the NMOS device depicted in FIGS. 5 and 6.

When the polygate 64 of the NMOS device 52' (FIG. 5) is provided with a positive charge and the device 52' attains a prescribed ($\Delta V$) max, the associated n⁺/p gated diode 54 reverse-biases. The p-substrate 56 will be in a depletion mode to enable the gated diode 54 to divert or shunt current away from the device 52' and to the substrate.

When the polygate 64 of the NMOS device 52' (FIG. 6) is provided with a negative charge and the device 52' attains a prescribed ($\Delta V$) max, the associated n⁺/p gated diode 54 will forward bias. The p-substrate will be in an accumulation mode and divert current from the device 52' to the substrate.

As was mentioned previously in conjunction with the PMOS device depicted in FIGS. 3 and 4, the protective circuit 54 for use with the NMOS devices depicted in FIGS. 5 and 6 can be in the form of an p⁺/n gated diode rather than the n⁺/p structure that is depicted. Moreover, for each of the PMOS and NMOS devices described previously, a multitude of such devices, denoted by D, can be protected by a single gated diode structure in accordance with the teaching of the present invention, as indicated by phantom connection lines 76' in FIG. 6.

While this invention has been described with reference to several illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
    a semiconductor layer of a first conductivity type;
    a transistor in said semiconductor layer including a source region and a drain region defining a channel region therebetween, a gate oxide layer formed over said channel region extending between said source region and said drain region, and a conductive gate disposed over said gate oxide layer;
    a gated diode in said semiconductor layer including a pair of spaced apart regions of a second conductivity type opposite said first conductivity type defining a channel region therebetween, a gate oxide layer disposed over said channel region, and a conductive gate disposed over said gate oxide layer;
    a first conductor connecting said conductive gate of said gated diode to said semiconductor layer; and
    a second conductor connecting said pair of spaced apart regions of said gated diode to said conductive gate of said transistor.

2. The semiconductor device of claim 1, further comprising a well of said second conductivity type disposed in said semiconductor layer, said source and drain regions of said transistor being of said first conductivity type and disposed in said well.

3. The semiconductor device of claim 1, in which said first conductivity type is p type and said second conductivity type is n type.

4. The semiconductor device of claim 1, in which said source and drain regions are of said second conductivity type which is opposite said first conductivity type.

5. The semiconductor device of claim 1, in which said conductive gates of said transistor and said gated diode are polysilicon.

6. The semiconductor device of claim 1, in which said first and second conductors are a metal.

7. The semiconductor device of claim 6, in which said metal is aluminum, tungsten or copper.

8. The semiconductor device of claim 1, in which the semiconductor layer is silicon.

9. A semiconductor device comprising:
    a semiconductor layer of a first conductivity type;
    a first transistor including a source region formed in said semiconductor layer, a drain region formed in said semiconductor layer, a gate oxide layer formed over a channel region in said semiconductor layer extending between said source region and said drain region, and a conductive gate formed over said gate oxide layer;
    a gated diode including a first and second moat regions of a second conductivity type opposite said first conductivity type formed in said semiconductor layer, a gate oxide layer formed over a channel region in said semiconductor layer extending between said first and second moat regions, and a conductive gate formed over said gate oxide layer;
    a first conductor connecting said conductive gate of said gated diode to said semiconductor layer; and
    a second conductor connecting said first and second moat regions of said gated diode to said conductive gate of said first transistor;
    wherein the gate oxide layer of said first transistor has a thickness of less than about 100 Angstroms.

10. The semiconductor device of claim 1, wherein the gate oxide layer of said transistor has a thickness of less than about 100 Angstroms.

* * * * *